US012529758B2

(12) United States Patent
Song et al.

(10) Patent No.: US 12,529,758 B2
(45) Date of Patent: Jan. 20, 2026

(54) RADAR TRANSCEIVER AND ANTENNA SHARING METHOD THEREOF

(71) Applicants: IMEC VZW, Leuven (BE); STICHTING IMEC NEDERLAND, Eindhoven (NL)

(72) Inventors: Minyoung Song, Eindhoven (NL); Peng Zhang, Veldhoven (NL); Barend Wilhelmus Marinus van Liempd, Holsbeek (BE)

(73) Assignees: IMEC VZW, Leuven (BE); Stitching IMEC Nederland, Eindhoven (NL)

( * ) Notice: Subject to any disclaimer, the term of this patent is extended or adjusted under 35 U.S.C. 154(b) by 451 days.

(21) Appl. No.: 17/933,253

(22) Filed: Sep. 19, 2022

(65) Prior Publication Data

US 2023/0194656 A1 Jun. 22, 2023

(30) Foreign Application Priority Data

Dec. 20, 2021 (EP) .................................... 21215830

(51) Int. Cl.
  *G01S 7/285* (2006.01)
  *G01S 7/03* (2006.01)
  *H03H 11/34* (2006.01)
(52) U.S. Cl.
  CPC .............. *G01S 7/285* (2013.01); *G01S 7/036* (2013.01); *H03H 11/344* (2013.01)
(58) Field of Classification Search
  CPC ........ G01S 7/285; G01S 7/036; H03H 11/344
  See application file for complete search history.

(56) References Cited

U.S. PATENT DOCUMENTS

| 8,866,667 | B2 | 10/2014 | Vacanti | |
|---|---|---|---|---|
| 10,782,390 | B2 | 9/2020 | Lien et al. | |
| 2003/0193997 | A1* | 10/2003 | Dent | H04B 1/0458 375/219 |
| 2014/0169231 | A1* | 6/2014 | Mikhemar | H04B 15/00 370/277 |
| 2016/0241323 | A1 | 8/2016 | Ko et al. | |
| 2017/0195108 | A1 | 7/2017 | Liu | |
| 2019/0319681 | A1* | 10/2019 | Natarajan | H04B 7/2621 |
| 2020/0106474 | A1* | 4/2020 | Hur | H04B 1/006 |

(Continued)

OTHER PUBLICATIONS

Extended European Search Report and Written Opinion, Application No. EP21215830.7, mailed May 17, 2022, 12 pages.

(Continued)

*Primary Examiner* — Robert W Hodge
*Assistant Examiner* — Bongani Jabulani Mashele
(74) *Attorney, Agent, or Firm* — MCDONNELL BOEHNEN HULBERT & BERGHOFF LLP

(57) ABSTRACT

A radar transceiver is provided. The radar transceiver includes an electrical balance duplexer that is coupled to a transmission node of a transmission path, a reception node of a reception path, and an antenna node and that is configured to isolate the transmission path from the reception path. The electrical balance duplexer includes a hybrid transformer network and a non-tunable balancing impedance. The non-tunable balancing impedance is configured to provide a fixed impedance value that corresponds to an impedance value at the antenna node.

19 Claims, 10 Drawing Sheets

(56) References Cited

U.S. PATENT DOCUMENTS

2020/0209349 A1* 7/2020 Shin .................. G01S 7/038

OTHER PUBLICATIONS

Kalantari, Milad, Wang Li, Hossein Shirinabadi, Ali Fotowat-Ahmady, and C. Patrick Yue. "A W-band single-antenna FMCW radar transceiver with adaptive leakage cancellation." IEEE Journal of Solid-State Circuits 56, No. 6 (2020): 1655-1667.

Feger, Reinhard, Christoph Wagner, Stefan Schuster, Stefan Scheiblhofer, Herbert Jager, and Andreas Stelzer. "A 77-GHz FMCW MIMO radar based on an SiGe single-chip transceiver." IEEE Transactions on Microwave theory and Techniques 57, No. 5 (2009): 1020-1035.

Anajemba, Joseph Henry, Yue Tang, James Adu Ansere, and Samson Hansen Sackey. "Efficient switched digital beamforming radar system based on SIMO/MIMO receiver." In 2019 Computing, Communications and IoT Applications (ComComAp), pp. 411-416. IEEE, 2019.

Cao, Yuhe, and Jin Zhou. "A CMOS 0.5-2.5 GHz full-duplex MIMO receiver with self-adaptive and power-scalable RF/analog wideband interference cancellation." In 2019 IEEE Radio Frequency Integrated Circuits Symposium (RFIC), pp. 147-150. IEEE, 2019.

Cao, Yuhe, and Jin Zhou. "Integrated self-adaptive and power-scalable wideband interference cancellation for full-duplex MIMO wireless." IEEE Journal of Solid-State Circuits 55, No. 11 (2020): 2984-2996.

Van Liempd, Barend, Benjamin Hershberg, Kuba Raczkowski, Saneaki Ariumi, Udo Karthaus, Karl-Frederik Bink, and Jan Craninckx. "2.2 A+ 70dBm IIP3 single-ended electrical-balance duplexer in 0.18 um SOI CMOS." In 2015 IEEE International Solid-State Circuits Conference—(ISSCC) Digest of Technical Papers, pp. 1-3. IEEE, 2015.

* cited by examiner

800C

900

```
┌─────────────────────────────────┐
│ Coupling an electrical balance duplexer │
│ comprising a hybrid transformer network │──── 901
│ and a non-tunable balancing impedance to │
│ a transmission node of a transmission path, │
│ a reception node of a reception path, │
│ and an antenna node │
└─────────────────────────────────┘
                 │
                 ▼
┌─────────────────────────────────┐
│ Isolating the transmission path from the │──── 902
│ reception path by means of the electrical │
│ balance duplexer │
└─────────────────────────────────┘
```

Fig. 9

RADAR TRANSCEIVER AND ANTENNA SHARING METHOD THEREOF

CROSS-REFERENCE TO RELATED APPLICATIONS

The present application is a non-provisional patent application claiming priority to European Patent Application No. EP 21215830.7, filed Dec. 20, 2021, the contents of which are hereby incorporated by reference.

FIELD OF THE DISCLOSURE

The present disclosure relates to a radar transceiver that employs an antenna sharing technique. The present disclosure further relates to methods for operating such a radar transceiver.

BACKGROUND

Generally, among other things, an electrical balance duplexer (EBD) may be used to isolate a transmitter and a receiver and enable them to share a common antenna. In typical full-duplex operation, i.e. the simultaneous operation of both the transmitter and the receiver, the EBD's balance network is tuned to achieve very high spillover rejection, e.g., to reduce the direct leakage through the EBD. This can be done to reduce receiver desensitization as a result of the transmitter spillover. This tuning is generally cumbersome, may involve either heavy algorithmic adaptive programming of a complex impedance network, e.g., high-dimensional genetic algorithms, multi-layer optimization techniques, heavy reliance on heuristics, or may require additional hardware, e.g., to sense the antenna impedance in order to optimize the balance network with simpler algorithms.

Furthermore, the balance network may include several complex tuning structures that are silicon-area intensive. Because of the fact that the balance network sustains half of the transmitter energy under load, switched-component devices with multiple stacked transistor-based switch devices are used to avoid switch breakdown or the addition of significant nonlinearity products in the receiver path, due to nonlinear switch behavior. Additionally, EBDs typically achieve a high spillover rejection, e.g. more than 50 dB, in a very narrow bandwidth. This is because the antenna-versus-balance network impedance balance can be maintained to such high accuracy only for a single frequency.

For example, the document US 2020/0209349 A1 presents radar circuitry that includes an electrically balanced duplexer as an isolator that isolates a transmission signal path and a reception signal path. The electrically balanced duplexer is provided with a variable impedance tuner that includes processor circuitry in order to sense and further to adjust the impedance at the balance network to match the impedance of the antenna.

SUMMARY

The present disclosure provides a radar transceiver, a radar system, and a method of operation thereof that can provide improvements relative to conventional systems and methods.

According to a first aspect, a radar transceiver is provided. The radar transceiver comprises an electrical balance duplexer coupled to a transmission node of a transmission path, a reception node of a reception path, and an antenna node, and is configured to isolate the transmission path from the reception path. The electrical balance duplexer comprises a hybrid transformer network and a non-tunable balancing impedance. In this regard, the non-tunable balancing impedance is configured to provide a fixed impedance value that is defined corresponding to an impedance at the antenna node.

The present disclosure provides an antenna sharing technique in a radar transceiver by means of a pre-operation-tuned electrical balance duplexer with its balancing impedance realized in the form of a balance network that may comprise resistive elements and/or inductive elements and/or capacitive elements, and is pre-tuned or is predefined to a fixed impedance value corresponding to an impedance value anticipated at the antenna node. A design method may be employed including in-situ measurements of the impedance of the antenna device employed at the antenna node, in order to enable design of the fixed impedance value to provide an improved balance condition across frequency for the nominal antenna conditions.

Moreover, the non-tunable balancing impedance, especially the impedance of the non-tunable balancing impedance may be defined based on the design trade-offs of the hybrid transformer network of the electrical balance duplexer, e.g. isolation, loss, coupling, and the like. This addresses the problems associated with the conventional impedance-tuning schemes of an electrical balance duplexer.

The radar transceiver can further include an antenna coupled to the antenna node, whereby the impedance value at the antenna node corresponds to an impedance of the antenna. By explicitly not tuning the electrical balance duplexer and by co-designing the non-tunable balancing impedance together with the antenna impedance, which is assumed known a priori to the chip design, a sufficiently high spillover rejection can be achieved whereby avoiding the complexities associated with impedance-tuning and enabling a balance impedance structure with reduced physical dimensions compared to a tunable counterpart.

The transmission path can include a signal generator followed by a power amplifier, whereby an output of the power amplifier is coupled to the transmission node. In addition, the reception path comprises a low-noise amplifier followed by a mixer followed by a high-pass filter, whereby an input of the low-noise amplifier is coupled to the reception node.

Alternatively, the reception path may comprise a mixer followed by a high-pass filter, whereby an input of the mixer is coupled to the reception node. By implementing the high-pass filter in the analog baseband section along with the proposed electrical balance duplexer, for example providing the high-pass filter downstream to the electrical balance duplexer along the reception path, a high spillover suppression can be achieved along the reception path in order to avoid sidelobes in the range-Doppler response of the radar.

In particular, the high-pass filter and the isolation from the proposed electrical balance duplexer jointly suppress any self-interference, i.e. interference caused by the radar transmission path, especially according to a permissible limit across the required or operating bandwidth.

The transmission path can be configured to generate a transmit signal and further to transmit the transmit signal via the hybrid transformer network and the antenna. Additionally, the reception path is configured to receive an antenna signal indicative of an incoming echo, through electromagnetic transduction, e.g. from an object or target, or from a neighboring or a further antenna, or rebounding off a nearby object such as the radar radome, corresponding to the transmit signal via the antenna and the hybrid transformer network.

The radar transceiver can further include a delay circuit, e.g., a tunable delay circuit, coupled between the signal generator and a local oscillation signal input of the mixer. The delay circuit is configured to delay the transmit signal, by a pre-defined amount or by a tunable amount, thereby providing a delayed version of the transmit signal to the local oscillation signal input of the mixer.

In this regard, the delay may correspond to a delay of a spillover signal from the transmission path to the reception path, especially through the electrical balance duplexer, e.g. through the hybrid transformer network of the electrical balance duplexer. Additionally or alternatively, the delay may correspond to a delay or delays in the antenna signal, which may in turn correspond to a specific unwanted echo, e.g. from the radome, or from a second radar transmitter if the radar is configured as an array of similar antenna-transmitter-receiver structures.

Hence, the tunable delay in the local oscillator chain may help to tune the local oscillator signal delay value prior to mixing with a delay in the spillover path from the transmission path to the reception path. The spillover signal can be moved to lower frequencies, which allows for a compact design of the high-pass filter and/or reduced requirements for the spillover rejection in the electrical balance duplexer.

The signal generator can include a frequency sweep generator and wherein the transmit signal comprises or is a swept-frequency signal. In other words, the signal generator may be a chirp signal generator and the transit signal may be a chirp signal, especially with a series of chirps with various ramps and frequencies. Furthermore, a bandwidth of the chirp signal may be selected or may be defined based on a desired or required range resolution of the radar or vice versa. The signal generator may operate at a scaled-down frequency compared to the RF operating frequency, and may comprise one or multiple frequency multipliers in order to improve power consumption and/or other system parameters.

The radar transceiver can further include a first switch coupled across the non-tunable balanced impedance, a second switch coupled in-between the non-tunable balanced impedance and a ground potential, and a switch-control circuit configured to operate the first switch and the second switch simultaneously.

In addition, the radar transceiver is configured to be operated in a first operation mode, a second operation mode, and a third operation mode. In this regard, the switch-control circuit is configured to open the first switch, and to close the second switch during the first operation mode, to close the first switch and the second switch during the second operation mode, and to open the first switch and the second switch during the third operation mode.

For instance, the first operation mode may correspond to a full-duplex mode, the second operation mode may correspond to a reception-only mode, and the third operation mode may correspond to a transmission-only mode.

By means of the first switch, the second switch, and the switching control, the radar transceiver can be operated in the full-duplex mode, the reception-only mode, and the transmission-only mode, where the modes can be switched from one another when needed.

Furthermore, the switching of the switches further allows the fixed balancing impedance of the electrical balance duplexer to be bypassed or to be grounded or to be disconnected from the electrical balance duplexer, thereby facilitating a duplexer-balun transformable transformer network.

The radar transceiver can further include a third switch coupled in-between the reception node and the input of the low-noise amplifier, and wherein the switch-control circuit is configured to operate the first switch, the second switch, and the third switch simultaneously. Alternatively, the low-noise amplifier may comprise of a transistor device that can be operated as such a third switch, to open the receiver-side winding of the hybrid transformer.

In this regard, the switch-control circuit is configured to open the first switch, and to close the second switch and the third switch during the first operation mode, to close the first switch, the second switch, and the third switch during the second operation mode, and to open the first switch, the second switch, and the third switch during the third operation mode.

By means of the first switch, the second switch, the third switch, and the switching control, the radar transceiver can be operated in the full-duplex mode, the reception-only mode, and the transmission-only mode, where the modes can be switched from one another when needed.

Furthermore, the switching of the first switch and the second switch further allows the fixed balancing impedance of the electrical balance duplexer to be bypassed or to be grounded or to be disconnected from the electrical balance duplexer, thereby facilitating a duplexer-balun transformable transformer network in reception-only mode. In this mode, the power amplifier may comprise of a transistor output device that can be configured to provide a high impedance at its output node such that the balun transformer network operates with low loss.

Moreover, the switching of the third switch, for example during the transmission-only mode, can mitigate insertion loss caused by signal splitting in the hybrid transformer network of the electrical balance duplexer.

It is to be noted that, explicitly, the first switch, the second switch, and the third switch are for mode control only as described above, and are not intended for dynamic operation such as could be required in an adaptively tuned electrical-balance duplexer.

The transmission path and the reception path can include single-ended transmission lines and/or connections. Alternatively, the reception path can include differential transmission lines, devices, and/or connections.

It is also conceivable that the electrical balance duplexer may be inversely connected with respect to the transmitter node and the receiver node, i.e. connecting the low-noise amplifier or mixer to a primary winding, especially a center-tap on the primary winding, of the hybrid transformer which is connected to the antenna and balancing network, and a power amplifier to a secondary winding of the hybrid transformer. In that case, the transmission path may comprise single-ended or differential transmission lines, devices and/or connections as well. In such an embodiment, switches as described prior may similarly be employed to devise full-duplex, transmit-only or receive-only operation modes. For example, the flexibility in system design is improved while otherwise maintaining the same concepts and benefits of the proposed system.

The electrical balance duplexer can include a wideband electrical balance duplexer, for example having an operating bandwidth of or more than 500 MHz. Therefore, ultra-wideband (UWB) technologies are facilitated by the proposed radar transceiver.

According to a second aspect, a radar system is provided. The radar system comprises a plurality of radar transceivers according to the first aspect, wherein the radar transceivers are arranged in a one-dimensional array or in a two-dimensional array. Each of the plurality of radar transceivers can be configured to be operated in the first operation mode or in the second operation mode or in the third operation mode. A MIMO radar system based on the proposed radar transceiver is provided.

According to a third aspect, a method is provided for antenna sharing in a radar transceiver, such as the radar transceiver according to the first aspect. The method comprises a step of coupling an electrical balance duplexer comprising a hybrid transformer network and a non-tunable balancing impedance to a transmission node of a transmission path, a reception node of a reception path, and an antenna node. The method further comprises a step of isolating the transmission path from the reception path by means of the electrical balance duplexer. In this regard, the non-tunable balancing impedance is configured to provide a fixed impedance value that is defined corresponding to an impedance value at the antenna node.

It is to be noted that the radar system according to the second aspect and the method according to the third aspect correspond to the radar transceiver according to the first aspect and its implementation forms. Accordingly, the radar system of the second aspect and the method of the third aspect achieve the same advantages and effects as the radar transceiver of the first aspect and its respective implementation forms.

BRIEF DESCRIPTION OF THE FIGURES

The above, as well as additional, features will be better understood through the following illustrative and non-limiting detailed description of example embodiments, with reference to the appended drawings.

FIG. 9 illustrates a flowchart of an example method.

All the figures are schematic, not necessarily to scale, and generally only show parts which are necessary to elucidate example embodiments, wherein other parts may be omitted or merely suggested.

DETAILED DESCRIPTION

Reference will now be made in detail to various example embodiments, examples of which are illustrated in the accompanying drawings. However, the following embodiments may be variously modified and the range of the present invention is not limited by the following embodiments. Reference signs for similar entities in different embodiments are partially omitted.

Figure 1:
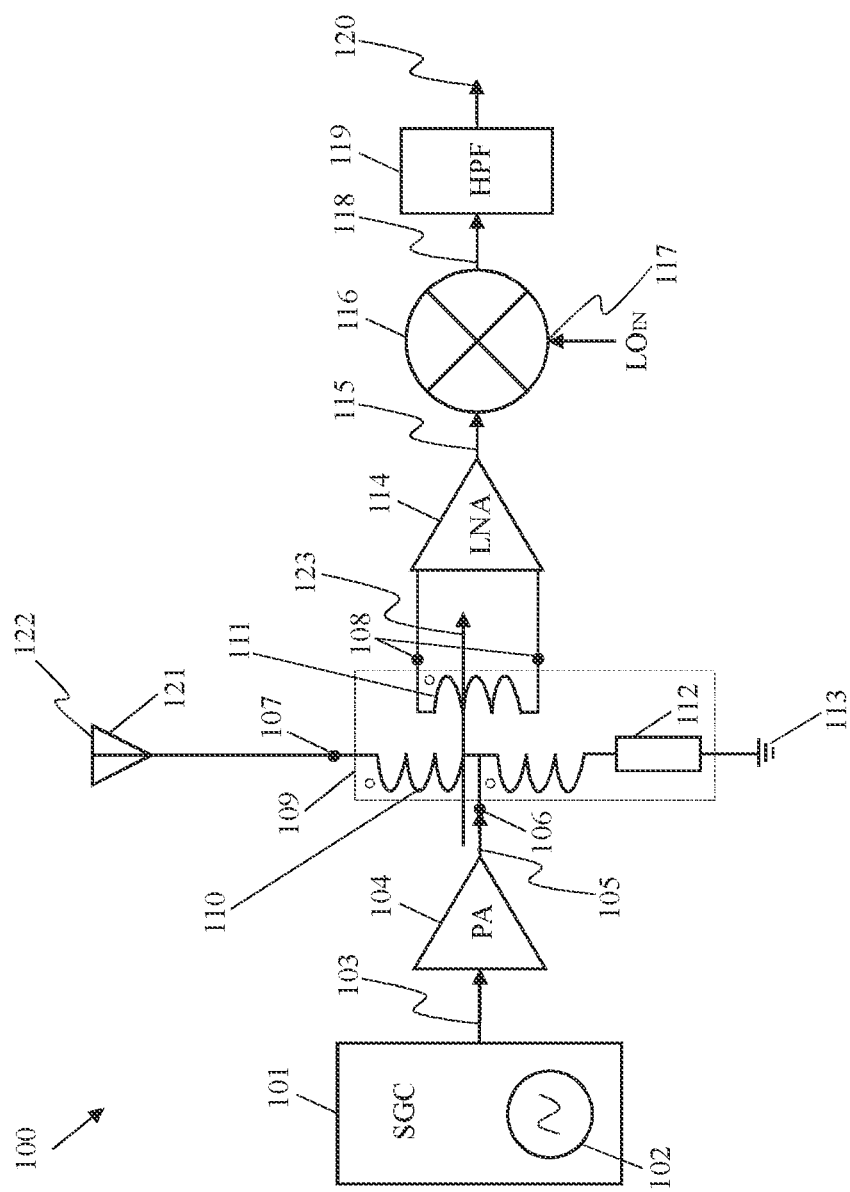
FIG. 1 schematically illustrates a radar transceiver, according to an example embodiment.

In FIG. 1, a first exemplary embodiment of the radar transceiver 100 is illustrated.

The radar transceiver 100 comprises a signal generation and control unit (SGC) 101 comprising a chirp signal generator or a chirp generator or a frequency synthesizer 102, and additional control circuitry to generate a transmit signal 103. The generation and/or control of the transmit signal 103 may include any known techniques or entities such as a signal synthesis chain that may comprise a full chirping phase-locked loop, frequency multipliers, signal splitters and amplification modules. The radar transceiver 100 further comprises an amplifier, especially a power amplifier (PA) 104, that is coupled to a transmission node 106. Hence, the PA 104 amplifies the transmit signal 103, thereby generating an amplified transmit signal 105 and feeds the amplified transmit signal 105 at the transmission node 106.

Therefore, the transmission path of the radar transceiver 100 comprises the signal generator 102, the PA 104, and optionally the SGC 101.

The radar transceiver 100 further comprises an electrical balance duplexer (EBD) 109. The EBD 109 comprises a hybrid transformer network including a primary winding or coil 110 and a secondary winding or coil 111, and a non-tunable balancing impedance 112. The non-tunable balancing impedance 112 is further coupled to a ground potential 113. The EBD 109 is coupled to the transmission node 106, to an antenna node 107, and to a reception node 108. The primary winding 110 of the hybrid transformer network can be coupled to the antenna node 107, to the transmission node 106, and to the non-tunable balancing impedance 112, so as to split the PA 104 output between an impedance at the antenna node 107 and the non-tunable balancing impedance 112. The secondary winding 111 of the hybrid transformer network is coupled to the reception node 108.

The hollow circles on the primary winding 110 and the secondary winding 111 of the hybrid transformer network denote the coupling directions. The non-tunable balancing impedance 112 is specifically designed to represent a fixed impedance value across frequency such that a resulting spillover component or signal 123, especially from the transmission path to the reception path through the EBD 109 across the frequency be at least lower than a required value, e.g. 20 dB.

The radar transceiver 100 can include an antenna 121 coupled to the antenna node 107, through which the transmission path may transmit the transmit signal 103 resp. the amplified transmit signal 105. The transmitted signal is normally reflected from all targets and the resulting echo or reflected signal or antenna signal 122 is received by the antenna 121. Generally, only a portion of the transmitted signal is reflected back to the antenna 121.

The radar transceiver 100 further comprises an amplifier, especially a low noise amplifier (LNA) 114, that amplifies the antenna signal 122, thereby generating a radar receive signal 115. A mixer, especially a frequency mixer 116 downstream to the LNA 114 demodulates the radar receive signal 115 with a carrier signal $LO_{IN}$ generated by the signal generator 102, especially by a local oscillator of the SGC 101, that is provided at a local oscillator input 117 of the mixer 116. Hence, the direct conversion of the radar receive signal 115 at the mixer 116 results in a baseband signal 118.

The radar transceiver 100 further comprises a high-pass filter (HPF) 119 downstream to the mixer 116 and filters the baseband signal 118, thereby generates a filtered baseband signal 120 or an analog baseband signal 120.

Hence, the reception path of the radar transceiver 100 comprises the LNA 114, the mixer 116, and the HPF 119, that form the analog baseband section of the reception path of the radar transceiver 100.

Figure 2:
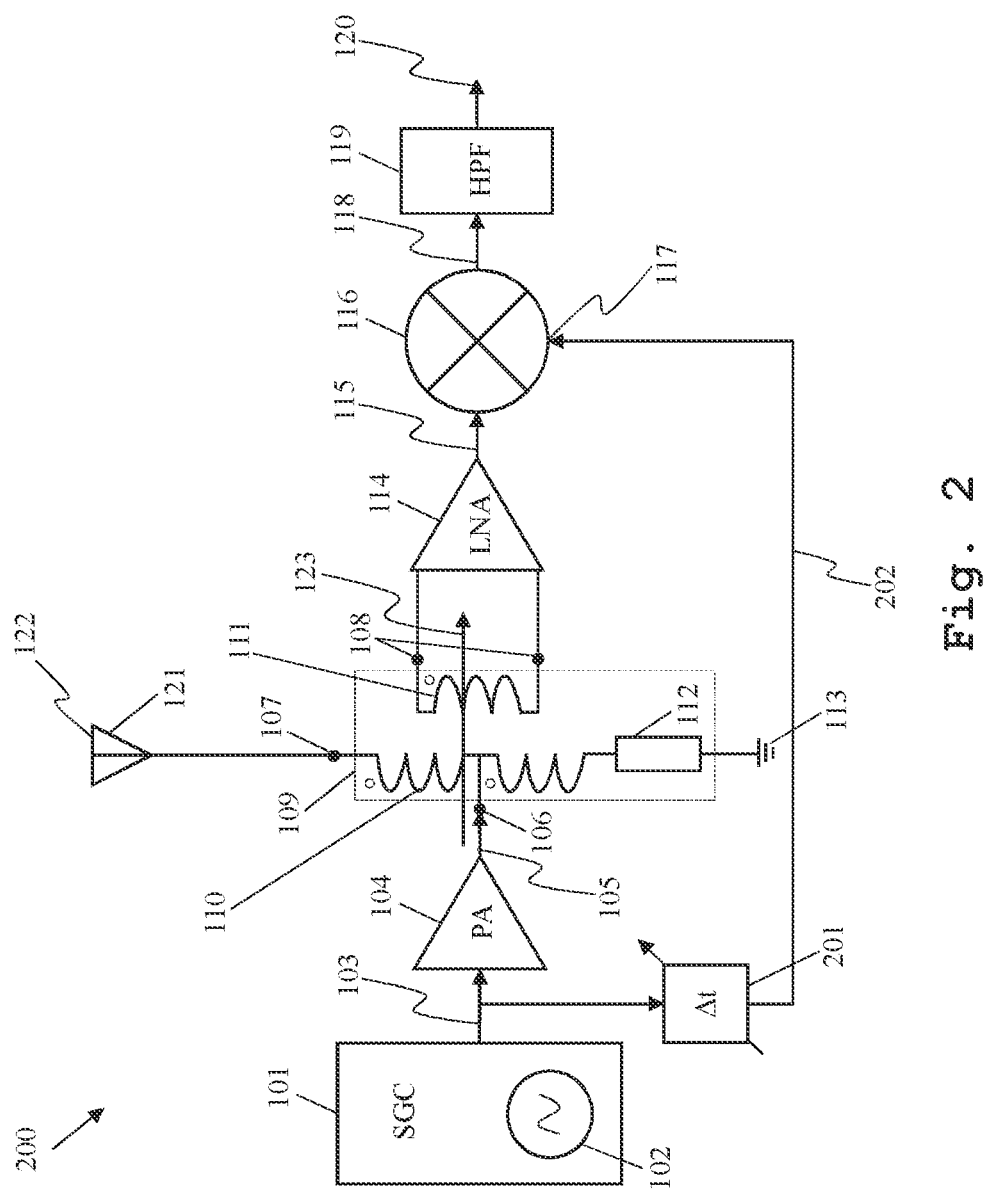
FIG. 2 schematically illustrates a radar transceiver, according to an example embodiment.

In FIG. 2, a second exemplary embodiment of a radar transceiver 200 is illustrated.

The radar transceiver 200 differs from the radar transceiver 100 in that the radar transceiver 200 further comprises a delay circuit, especially a tunable delay circuit 201 that is coupled in-between the signal generator 102 and the local oscillator input 117 of the mixer 116.

The delay circuit 201 receives the transmit signal 103 from the SGC 101 resp. the signal generator 102, and further delays, especially in time, the transmit signal 103, thereby generating a delayed version of the transmit signal 202. The delayed version of the transmit signal 202 is then provided at the local oscillator input 117 of the mixer 119 as the carrier signal LOIN to demodulate the radar receive signal 115.

The amount of delay introduced by the delay circuit 201 may correspond to the delay causing the spillover component or signal 123 to reach the receiving path through the EBD 109. By mimicking the delay and by using the delayed version of the transmit signal 202 at the mixer 116, the spillover signal 123 can be moved to lower intermediate frequencies (IF), i.e. in a zero-IF configuration closer to 0 Hz after frequency conversion, which allows for a more compact HPF 119 and/or less rejection in the EBD 109, freeing up a further degree of freedom in the system design. Moreover, by using the HPF 119 in the analog baseband section and the delay circuit 201 in the local oscillator chain, the spillover component resulting at the receiving path, especially at the reception node 108, only needs to avoid compression, while the overall chain of the EBD 109 and the HPF 119 can achieve sufficient spillover suppression i.e. in order to enable proper target detection in a subsequent radar signal processing chain after analog-to-digital conversion, or instead by an inference-based signal processor.

The delay circuit 201 may further be tuned or be configured to introduce a delay, especially in time, so as to mimic a delay in the incoming echo resp. the antenna signal 122. This is beneficial in such cases where the transmitted signal is effectively rebounding off a nearby object such as the radome or a bumper in automotive applications, and the delay is tuned to mimic that echo's delay through the full back-and-forth chain.

Figure 3:
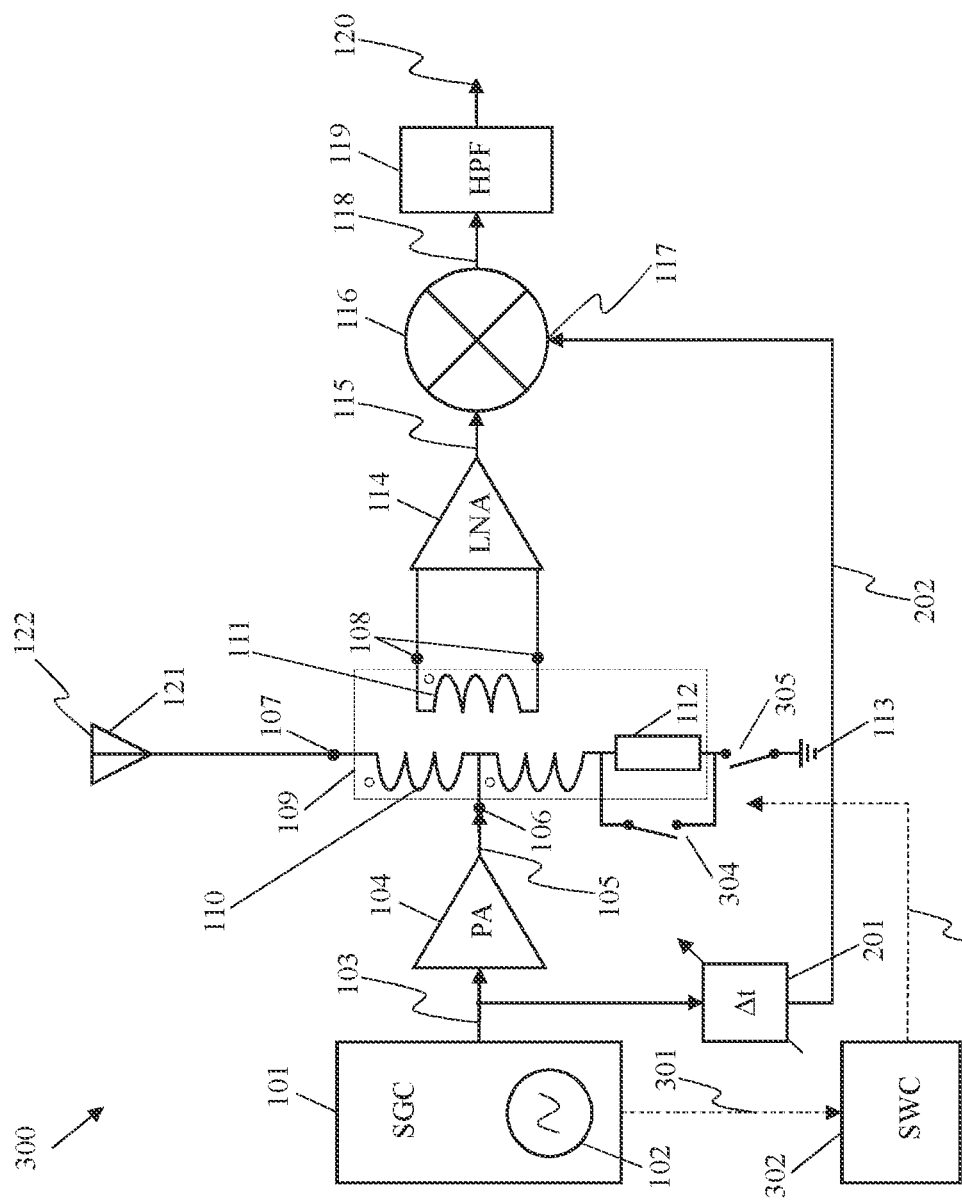
FIG. 3 schematically illustrates a radar transceiver, according to an example embodiment.

In FIG. 3, a third exemplary embodiment of a radar transceiver 300 is illustrated.

The radar transceiver 300 comprises, in addition to the radar transceiver 200, a switch-control circuit (SWC) 302, a first switch 304 coupled across the non-tunable balanced impedance 112, and a second switch 305 coupled in-between the non-tunable balanced impedance 112 and the ground potential 113. The SWC 302 can generate control signals 303 to simultaneously operate the first switch 304 and the second switch 305. Alternatively, the SGC 101 may generate control commands 301 for the SWC 302 and/or configure the SWC 302 in order to generate the control signals 303.

In this regard, the switching of the first switch 304 and the second switch 305 facilitates the radar transceiver 300 to be operated in a first operation mode, hereinafter referred as full-duplex (FD) mode, a second operation mode, hereinafter referred as reception-only (RX-only) mode, and a third operation mode, hereinafter referred as transmission-only (TX-only) mode. It is to be noted that the operation modes do not follow any sequential order and the radar transceiver 300 is only operable in one of the above operation modes at a given operation time or period.

During the FD mode, the SWC 302 opens the first switch 304 and closes the second switch 305. By way of this, the non-tunable balanced impedance 112 is therefore coupled to the primary winding 110 as well as to the ground potential. Hence, the EBD 109 operates normally to isolate the transmission path from the reception path. Particularly, when the transmit signal is transmitted, and the antenna impedance $Z_{ANT}$ equals the impedance of the non-tunable balanced impedance 112 $Z_{BAL}$ at the transmission frequency, the electrical signals splits up exactly between the two impedances, i.e., perfect common-mode to the hybrid transformer.

As a result, a reduced net differential current flows through the primary winding 110 of the hybrid transformer, and only the common-mode leakage, especially for a differential arrangement of the reception path, as the spillover signal 123 transfers through to the hybrid transformer secondary side 111, cancelling any direct-path transmission path leakage flowing into the reception path. While receiving via the antenna 122, the antenna signal 122 is not excited in the non-tunable balanced impedance 112. As a result, a differential current flows through the hybrid transformer and is transferred to the reception node 108 of the reception path. Since the signals are evenly distributed to the $Z_{ANT}$ and $Z_{BAL}$, there is inherit a minimal insertion loss of 3 dB.

During the RX-only mode, the SWC 302 closes the first switch 304 and the second switch 305. As a result, the non-tunable balanced impedance 112 is completely bypassed to the ground potential. In addition to this, the SGC 101 may stop generating and/or transmitting the transmit signal 103 during the RX-only mode, thereby effectively turning off the transmission operation along the transmission path during the RX-only mode. Hence, the hybrid transformer network acts as a balun during the RX-only mode, which effectively avoids the inherit signal-splitting insertion loss of the EBD 109.

During the TX-only mode, the SWC 302 opens the first switch 304 and the second switch 305. As a result, the non-tunable balanced impedance 112 is completely disconnected or isolated from the hybrid transformer network of the EBD 109.

The following table describes the individual switching operations and their respective effects:

TABLE 1

| Mode | TX | SW1 | SW2 | Splitting Loss |
| --- | --- | --- | --- | --- |
| FD | On | Open | Closed | 3 dB |
| RX-only | Off | Closed | Closed | ~0 dB |
| TX-only | On | Open | Open | ~0 dB |

Figure 4:
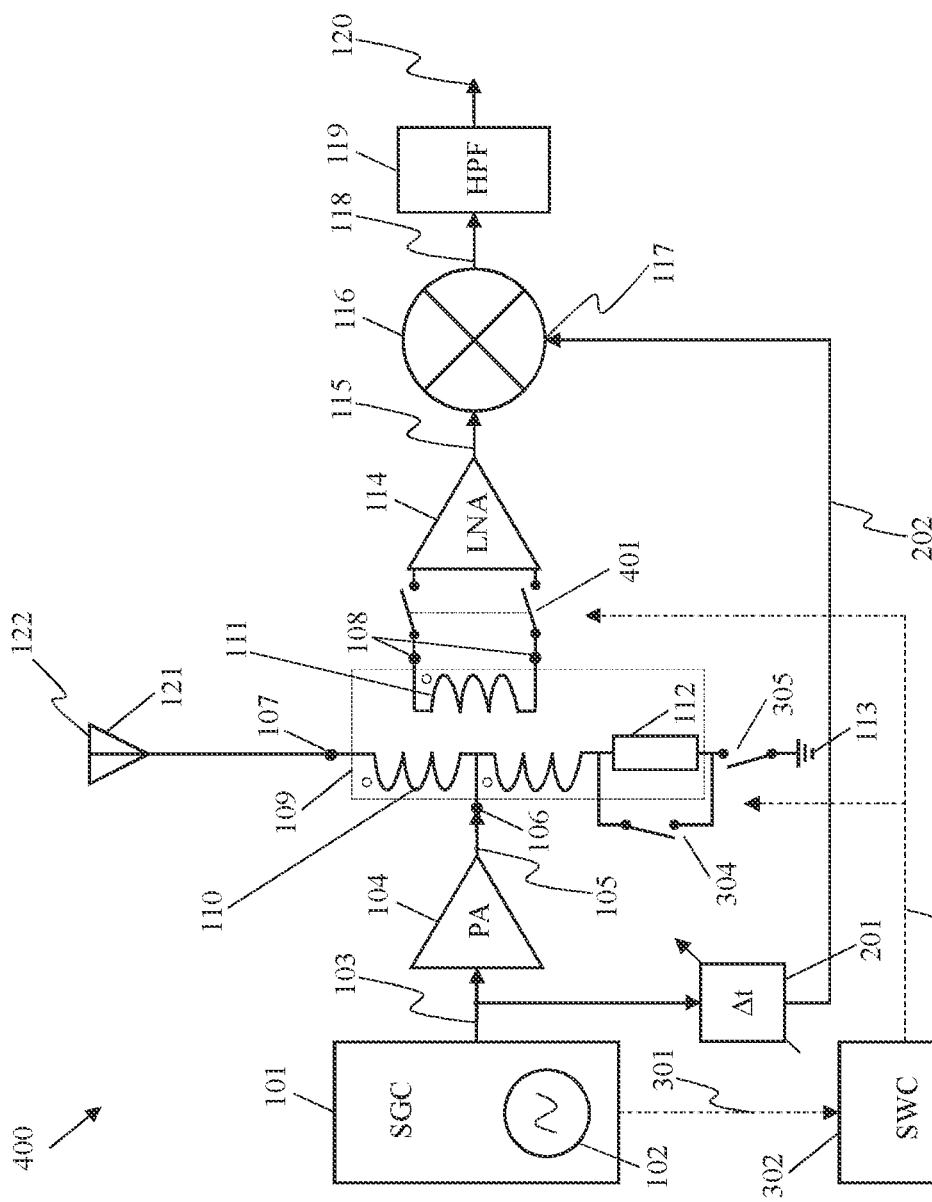
FIG. 4 schematically illustrates a radar transceiver, according to an example embodiment.

In FIG. 4, a fourth exemplary embodiment of a radar transceiver 400 is illustrated.

The radar transceiver 400 comprises, in addition to the radar transceiver 300, a third switch 401 coupled in-between the reception node 108 and the input of the LNA 114. In some examples, the SWC 302 can generate control signals 303 to simultaneously operate the first switch 304, the second switch 305, and the third switch 401. Alternatively, the SGC 101 may generate control commands 301 for the SWC 302 and/or configure the SWC 302 in order to generate the control signals 303.

In this regard, the switching of the first switch 304, the second switch 305, and the third switch 401 facilitates the radar transceiver 300 to be operated in the full-duplex (FD) mode, the reception-only (RX-only) mode, and the transmission-only (TX-only) mode. It is to be noted that the operation modes do not follow any sequential order and the radar transceiver 400 is only operable in one of the above operation modes at a given operation time or period.

During the FD mode, the SWC 302 opens the first switch 304, and closes the second switch 305 and the third switch 401. By way of this, the non-tunable balanced impedance 112 is therefore coupled to the primary winding 110 as well as to the ground potential. Hence, the EBD 109 operates normally to isolate the transmission path from the reception path. Particularly, when the transmit signal is transmitted, and the antenna impedance $Z_{ANT}$ equals the impedance of the non-tunable balanced impedance 112 $Z_{BAL}$ at the transmission frequency, the electrical signals splits up exactly between the two impedances, i.e., perfect common-mode to the hybrid transformer.

In view of imperfections in practical lay-out in the hybrid transformer, as well as a conscious design choice, the signal split factor may not exactly be 50-50 in some embodiments, which implies trading off loss for isolation. This is also referred to as the skewing of the hybrid transformer. Note that such a skewing factor can also be introduced by providing an impedance value that by design is offset from the antenna impedance as part of the design of the electrical-balance duplexer.

As a result, a reduced net differential current flows through the primary winding 110 of the hybrid transformer, and only the common-mode leakage as the spillover signal 123 transfers through to the hybrid transformer secondary side 111, cancelling any direct-path transmission path leakage flowing into the reception path. While receiving via the antenna 122, the antenna signal 122 is not excited in the non-tunable balanced impedance 112. As a result, a differential current flows through the hybrid transformer and is transferred to the reception node 108 of the reception path. Since the signals are evenly distributed to the $Z_{ANT}$ and $Z_{BAL}$, there is inherently a minimal insertion loss of 3 dB.

During the RX-only mode, the SWC 302 closes the first switch 304, the second switch 305, and the third switch 401. As a result, the non-tunable balanced impedance 112 is completely bypassed to the ground potential. In addition to this, the SGC 101 may stop generating and/or transmitting the transmit signal 103 during the RX-only mode, thereby effectively turning off the transmission operation along the transmission path during the RX-only mode. Hence, the hybrid transformer network acts as a balun during the RX-only mode, thereby effectively avoiding the inherit signal-splitting insertion loss of the EBD 109.

During the TX-only mode, the SWC 302 opens the first switch 304, the second switch 305, and the third switch 401. As a result, the non-tunable balanced impedance 112 is completely disconnected or isolated from the hybrid transformer network of the EBD 109. Additionally, the reception path is isolated from the transmission path. Consequently, the isolation between the transmission path and the reception path is drastically improved whereby providing only one signal transmission path from the transmission node 106 to the antenna node 107. As an added benefit, the inherit insertion loss of the EBD 109 is also effectively avoided.

The following table describes the individual switching operations and their respective effects:

TABLE 2

| Mode | TX | SW1 | SW2 | SW3 | Splitting Loss |
| --- | --- | --- | --- | --- | --- |
| FD | On | Open | Closed | Closed | 3 dB |
| RX-only | Off | Closed | Closed | Closed | ~0 dB |
| TX-only | On | Open | Open | Open | ~0 dB |

Figure 5:
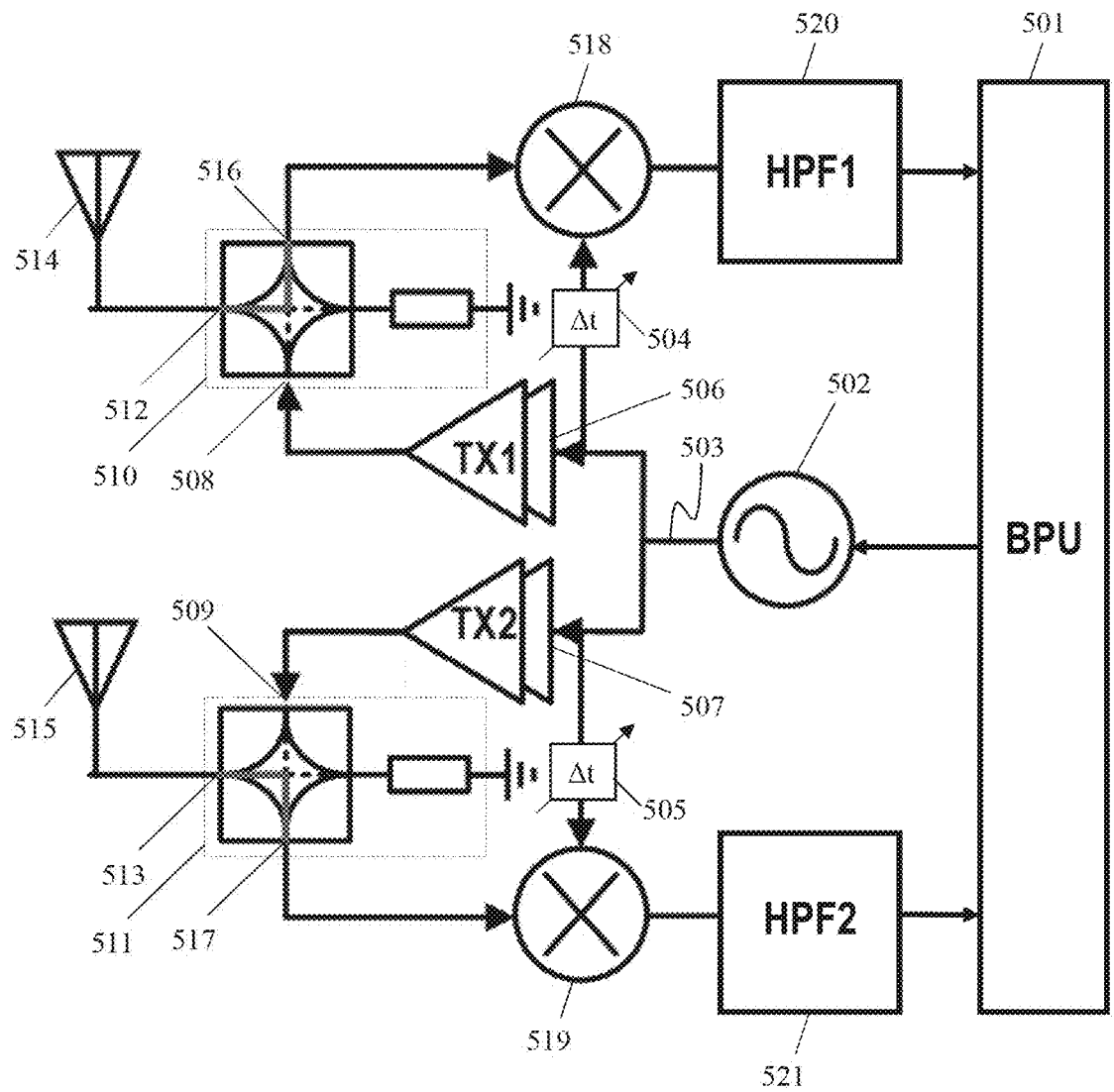
FIG. 5 schematically illustrates a radar transceiver, according to an example embodiment.

In FIG. 5, an exemplary embodiment of a radar system 500 is illustrated.

The radar system comprises a baseband processing unit (BPU) 501 that provides signal generation control to a signal generator or frequency synthesizer 502 in order to generate a transmit signal 503. The BPU 501 further performs baseband processing in the analog and/or digital domain. The radar system 500 further comprises a first radar transceiver and a second radar transceiver, where each of the transceivers may correspond to the radar transceivers 100, 200, 300, 400.

Specifically, the first radar transceiver comprises a first transmission block 506 downstream to the signal generator 502 that may include a power amplifier. The output of the first transmission block 506 is coupled to a first transmission node 508. The radar system 500 further comprises a first EBD 510 that is coupled to the first transmission node 508, to a first antenna node 512, and to a first reception node 516. A first antenna 514 may be coupled to the first antenna node 512.

At the first reception node 516, especially downstream to the first EBD 510, the radar system 500 may optionally comprise a first LNA (not shown). The output of the LNA (or the first reception node 516 if the LNA is not present) is coupled to a first analog baseband processing block that may comprise a first frequency mixer 518 and a first HPF 520. The first HPF 520 may generate a filtered analog baseband signal for post-processing. The radar system 500 may additionally comprise a first delay circuit, especially a tunable delay circuit 504, coupled in-between the signal generator 502 and the first mixer 518 to provide a delayed version of the transmit signal 503 at the first mixer 518 as a local oscillator input signal.

The radar system 500 further comprises a second radar transceiver that comprises a first transmission block 507 downstream to the signal generator 502, which may include a power amplifier. The output of the second transmission block 507 is coupled to a second transmission node 509. The radar system 500 further comprises a second EBD 511 that is coupled to the second transmission node 509, to a second antenna node 513, and to a second reception node 517. A second antenna 515 may be coupled to the second antenna node 513.

At the second reception node 517, especially downstream to the second EBD 511, the radar system 500 may optionally comprise a second LNA (not shown). The output of the LNA (or the second reception node 517 if the LNA is not present) is coupled to a second analog baseband processing block that may comprise a second frequency mixer 519 and a second HPF 521.

The second HPF 521 may generate a filtered analog baseband signal for post-processing. The radar system 500 may additionally comprise a second delay circuit, especially a tunable delay circuit 505, coupled in-between the signal generator 502 and the second mixer 519 to provide a delayed version of the transmit signal 503 at the second mixer 519 as a local oscillator input signal.

The BPU 501 may optionally comprise the SGC 101 as illustrated along FIGS. 1-4 in order to generate and to provide control for signal generation. Alternatively, the SGC 101 may be implemented external to the BPU 501. The BPU 501 may comprise, for example, analog to digital converters for domain conversion of the respective analog baseband signals, a range processing block for radar range processing, and a discrete Fourier transformation (DFT) block for producing Doppler profiles.

The BPU 501, especially the underlying signal processing scheme, may be implemented by hardware, software, or any combination thereof. Furthermore, additional means for generating and/or processing radar signals, e.g. memory or storage for storing control commands, as well as interfaces such as user interface, are not explicitly shown but are apparent from the above-described implementation.

It is to be noted that the first radar transceiver is operable in the FD-mode or in the RX-only mode or in the TX-only mode. Similarly, the second radar transceiver is operable in the FD-mode or in the RX-only mode or in the TX-only mode. Although only two radar transceivers are illustrated herein, the number of radar transceivers is not limited by the presented example and can be selected based on a desired size of a virtual array to be formed out of the physical antenna array of the radar system 500, which will be described in the later section of the description.

Figure 6:
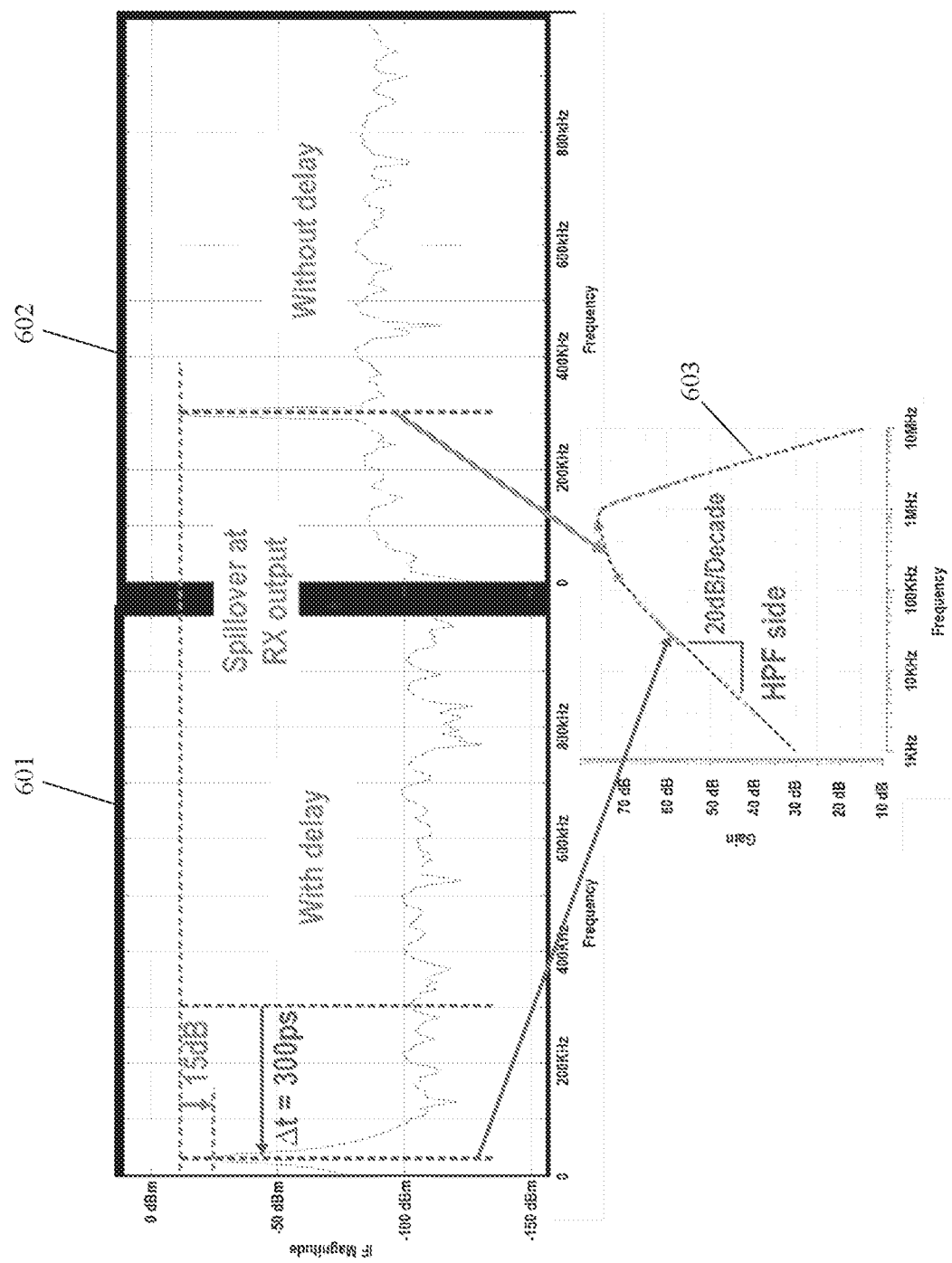
FIG. 6 illustrates the effect of a tunable delay on spillover rejection, according to an example embodiment.

In FIG. 6, the effect of a tunable delay, especially realized on the tunable delay circuit 201, 504, 505 described above, on spillover rejection is illustrated by way of an example. In particular, the first segment 601 at the top-left illustrates the spillover level at the baseband, i.e. at the receiver output, when the tunable delay circuit 201, 504, 505 is implemented. The horizontal axis denoted the frequency in kHz and the vertical axis denotes IF magnitude in dBm.

The second segment 602 at the top-right illustrates the spillover level at the baseband, i.e. at the receiver output, when the tunable delay circuit 201, 504, 505 is not included in the delay chain. The horizontal axis denoted the frequency in kHz and the vertical axis denotes IF magnitude in dBm.

At the bottom of FIG. 6, the filter profile 603 of the HPF 119, 520, 521 shows different delays at different instances over frequency, where the horizontal axis denotes frequency in kHz and the vertical axis denotes filter gain in dB. It is therefore conceivable that, for a given delay of 300 ps provided by the tunable delay circuit 201, 504, 505, the spillover level at the baseband is reduced by 15 dB.

Generally, in order to detect range or distance by measuring a "round-trip" time of electromagnetic pulse, the range can be calculated by $$R = \frac{c \cdot t}{2} \quad (1)$$

where c and t are speed of light and the round-trip time, respectively.

As the radar acts as a ranging sensor, it is important how far (maximum range) and how accurately (range resolution) the radar detects range. Maximum range can be defined by the classical radar equation, $$R_{MAX} = \sqrt[4]{\frac{P_{TX} G_{TX} G_{RX} \lambda^2 \sigma}{P_{RX}(4\pi)^3}} \quad (2)$$

where $P_{TX}$, $G_{TX}$, $G_{RX}$, $\lambda$, $\sigma$, $P_{RX}$ are transmitted power, TX and RX antenna gain, wavelength, and radar cross section, respectively.

Range resolution indicates how radar can distinguish between target objects. As shown in FIG. 2, the range resolution is determined by:

$$R_{RES} = \frac{c}{2 \cdot BW} \quad (3)$$

where BW is the operating bandwidth.

On top of range sensing, radar can estimate the angle of arrival with multiple TX or RX antennas by digital receiver-side beamforming. For instance, a single-input-multiple-output (SIMO) radar has at least two RX antennas with single TX antenna. If, for example, the reflected signal from the object at an angle θ arrives at two RX antennas by a distance d sin θ, the phase difference of arrived signals (ω), therefore, corresponds to $$\omega = \frac{2\pi}{\lambda} d \cdot \sin\theta \quad (4)$$

Which is used for the θ estimation by $$\theta = \sin^{-1}\left(\frac{\omega\lambda}{2\pi d}\right) \quad (5)$$

In this regard, the maximum detectable θ is +/−90°, which can be achieved with the physical antenna distance of λ/2.

From eq. (4), with the angle difference Δθ, ω can be also differed by Δω, $$\Delta\omega = \omega_2 - \omega_1 = \frac{2\pi d}{\lambda}(\sin(\theta + \Delta\theta) - \sin(\theta + \Delta\theta)) = \frac{2\pi d}{\lambda}(\cos(\theta)\Delta\theta) \quad (6)$$

Hence, Δω can be finely resolved by the number of antennas, N, 2π/N. Thus, antenna resolution, Δθ with d of λ/2 and a bore sight view (θ=0), $$\theta_{RES} = \frac{2}{N}(\text{rad}) \quad (7)$$

Therefore, the more antennas, the finer the angular resolution.

MIMO radar technology is a way to optimize the number of antennas to improve the angular resolution. For example, a 2×2 MIMO can achieve the equivalent angle resolution of 1×4 SIMO.

Figure 7:
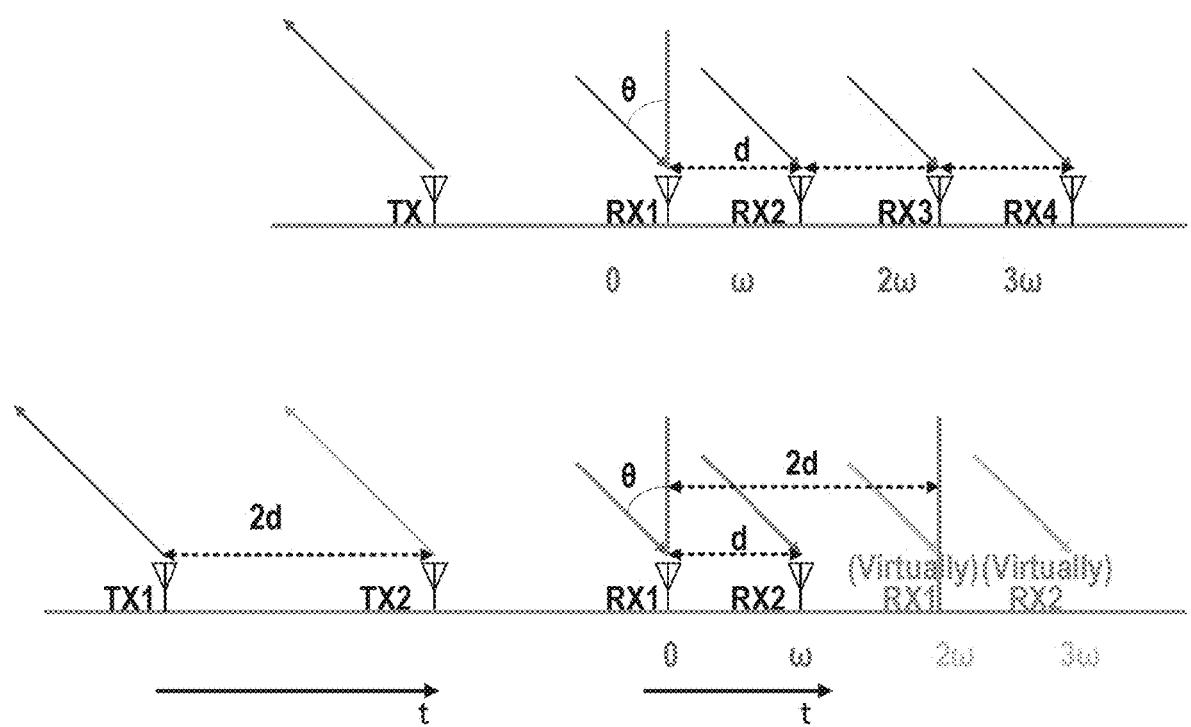
FIG. 7 schematically illustrates antenna configurations for SIMO and MIMO techniques, according to an example embodiment.

In FIG. 7, exemplary antenna configurations for conventional SIMO and MIMO techniques are illustrated. Especially, a 1×4 SIMO antenna configuration is shown at the top and a 2×2 MIMO antenna configuration is shown at the bottom.

As shown in FIG. 7, receivers RX can detect with a phase difference (ω) array, [0 ω], with the first transmitter TX1. When the second transmitter TX2 is physically 2d away from the first transmitter TX1, the receivers RX can detect with another ω array, [2ω 3ω], with the second transmitter TX2. Therefore, finally 4-virtual phase array, [0 ω 2ω 3ω], equivalent to 1×4 SIMO physical array, as shown in the top of FIG. 7. The horizontal arrow below the TXs and RXs of the MIMO configuration indicates the time instance or dimension for a time-division multiplexing operation of the TXs-RXs. In this case, MIMO requires 4 antennas, but 5 for SIMO. In general, for N elements in the array, SIMO requires 1+N antennas, but MIMO requires M+N/M antennas, where M and N/M are the number of transmitter and receiver antennas, respectively.

Figure 8A:
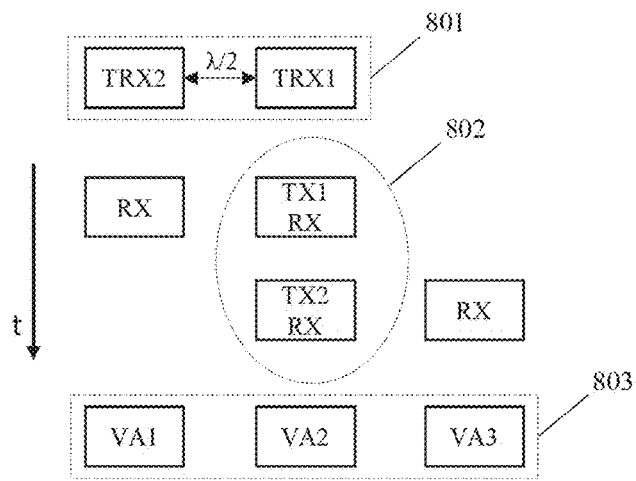
FIG. 8A schematically illustrates an arrangement of an antenna array of a radar system, according to an example embodiment.
Figure 8B:
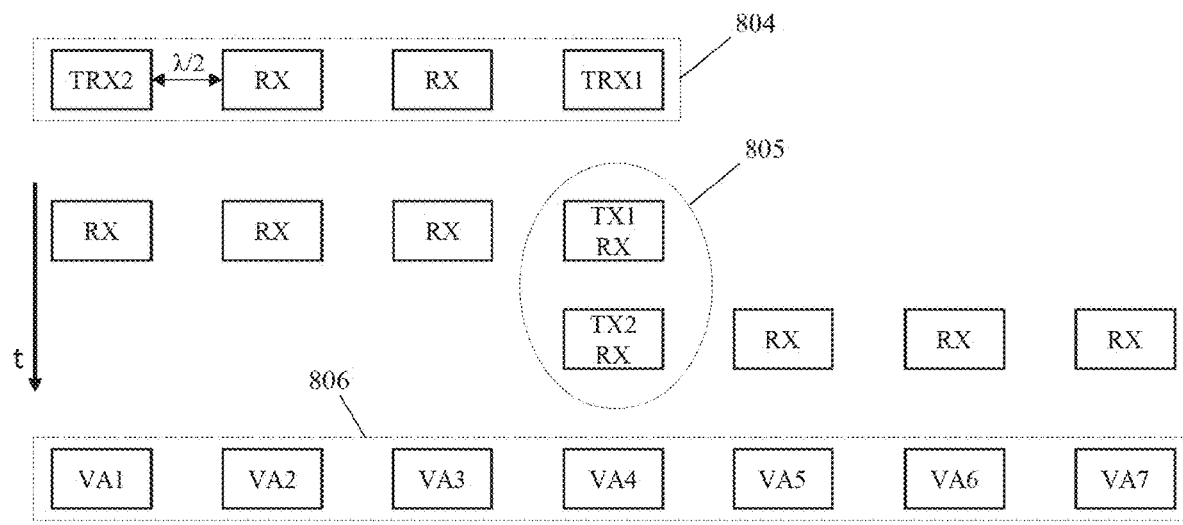
FIG. 8B schematically illustrates an arrangement of an antenna array of a radar system, according to an example embodiment.
Figure 8C:
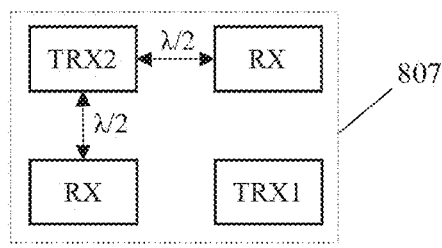
FIG. 8C schematically illustrates an arrangement of an antenna array of a radar system, according to an example embodiment.
Figure 8C:
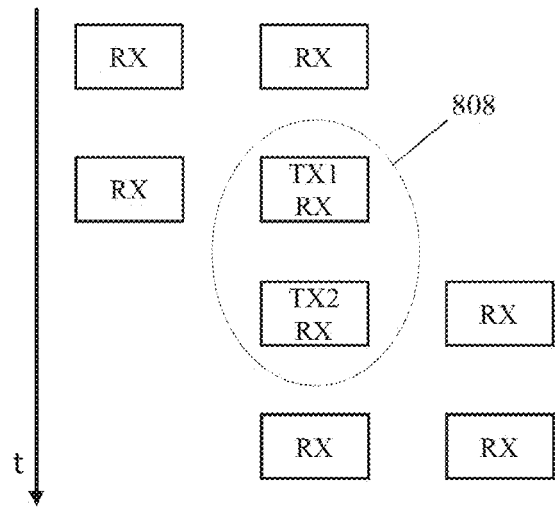
Figure 8C:
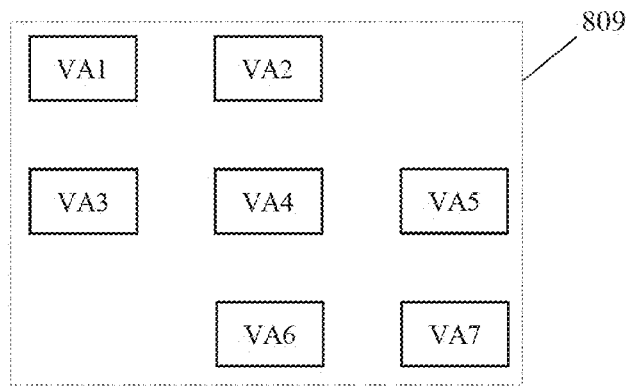

Along FIG. 8A, FIG. 8B, and FIG. 8C, different arrangements of an antenna array of the radar system 500, especially in the context of MIMO antenna sharing, are illustrated.

In FIG. 8A, an antenna array 800A, especially a physical antenna array in one-dimension, of the radar system 500 with two radar transceivers TRX1, TRX2 is illustrated. The physical array 801 is formed by physically separating the radar transceivers by a spacing at least of $\lambda/2$, where $\lambda$ is the free-space wavelength, in order to avoid any mutual coupling.

For instance, the radar transceivers TRX1, TRX2 are configured to be operated in the FD mode and/or in the RX-only mode, thereby forming a 2×2 MIMO physical array. For example, in a first time instance, the TRX1 operates in the FD mode and the TRX2 operates in the RX-only mode. Consequently, in a second time instance, the TRX1 operates in the RX-only mode and the TRX2 operates in the FD mode. The timing instance or dimension is shown by the downward vertical arrow, for example. The RXs can detect with a phase difference ($\omega$) array, [$-\omega$ 0], with the first TX at the second transceiver TRX2. Since the two antennas are as far apart as d, another $\omega$ array of [0 $\omega$], with the second TX at the first transceiver TRX1. This effectively provides a virtual array 803 of three antenna elements VA1, VA2, VA3, where the center 802 of the virtual array 803 is overlapped and is weighted by 2, i.e. 3-virtual phase array, [$-\omega$ 0 $\omega$], with only 2 physical antenna array, while with 4 physical antenna array in SIMO.

In FIG. 8B, an antenna array 800B, especially a physical antenna array in one-dimension, of the radar system 500 with four radar transceivers is illustrated. The physical array 804 is formed by physically separating the radar transceivers by a spacing at least of $\lambda/2$.

As illustrated, two of the radar transceivers are configured to be operated in the FD-mode and two of the radar transceivers are configured to be operated in the RX-only mode, thereby forming a 2×4 MIMO physical array. For example, in a first time instance, the TRX1 operates in the FD mode and the rest of the transceivers operate in the RX-only mode. Consequently, in a second time instance, the TRX2 operates in the FD mode and the rest of the transceivers operate in the RX-only mode. The timing instance or dimension is shown by the downward vertical arrow, for example.

The RXs can detect with a phase difference ($\omega$) array, [$-3\omega$ $-2\omega$ $-\omega$ 0], with the first TX at the second transceiver TRX2. Since the TRX2 and TRX1 are as far apart as d, another $\omega$ array of [0 $\omega$ 2$\omega$ 3$\omega$], with the second TX at the first transceiver TRX1. This effectively provides a virtual array 806 of seven antenna elements VA1, VA2, VA3, VA4, VA5, VA6, VA7 where the center 805 of the virtual array 806 is overlapped and is weighted by 2, i.e. 7-virtual phase array, [$-3\omega$ $-2\omega$ $-\omega$ 0 $\omega$ 2$\omega$ 3$\omega$], with only 4 physical antenna array, while with 8 physical antenna array in SIMO.

In FIG. 8C, an antenna array 800C, especially a physical antenna array in two-dimension, of the radar system 500 with four radar transceivers is illustrated. The physical array 807 is formed by physically separating the radar transceivers, especially along two-dimension (2D) by a spacing at least of $\lambda/2$.

As illustrated, two of the radar transceivers are configured to be operated in the FD-mode and two of the radar transceivers are configured to be operated in the RX-only mode, thereby forming a 2×4 MIMO physical array. The 2D arrangement of the 2×4 MIMO antenna array is capable of performing both azimuth and elevation estimation as well as azimuth only.

For example, in a first time instance, the TRX1 operates in the FD mode and the rest of the transceivers operate in the RX-only mode. Consequently, in a second time instance, the TRX2 operates in the FD mode and the rest of the transceivers operate in the RX-only mode. The timing instance or dimension is shown by the downward vertical arrow, for example.

This effectively provides a virtual array 809 of seven antenna elements VA1, VA2, VA3, VA4, VA5, VA6, VA7 where the center 808 of the virtual array 809 is overlapped and is weighted by 2.

It is to be noted that for the above-illustrated examples, the transceivers may exchange their operation modes or use different operation modes, e.g. the RXs may operate in the TX-only mode, which may result in different MIMO antenna configurations.

In FIG. 9, an exemplary embodiment of a method is illustrated. In a first step 901, an electrical balance duplexer comprising a hybrid transformer network and a non-tunable balancing impedance is coupled to a transmission node of a transmission path, a reception node of a reception path, and the antenna node. In a second step 902, the transmission paths is isolated from the reception path by means of the electrical balance duplexer.

This disclosure provides a radar transceiver with sharing antennas for both transmitter and receiver, and a MIMO radar comprising a plurality of the radar transceivers. With the antenna sharing, the number of the antennas can be minimized while improving the angle detection over a conventional array where a single antenna cannot share the transmit and receive function in a single element. The proposed electrical balance duplexer could be operable in the form of a transformable duplexer/balun, which allows for achieving the afore-mentioned effect. As such, the embodiments herein may bring the benefit to compact the system form factor, especially for MIMO radars, such as UWB MIMO radars.

It is important to note that, in the description as well as in the claims, the word "coupled" implies that the elements may be directly connected together or may be coupled through one or more intervening elements. Furthermore, the word "comprising" does not exclude other elements or steps and the indefinite article "a" or "an" does not exclude a plurality. A single element or other unit may fulfill the functions of several entities or items recited in the claims. Moreover, the description with regard to any of the aspects is also relevant with regard to the other aspects of the disclosure.

Although embodiments disclosed herein have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired for any given or particular application.

In the above embodiments have mainly been described with reference to a limited number of examples. However, as is readily appreciated by a person skilled in the art, other examples than the ones disclosed above are equally possible within the scope of the embodiments described herein, as defined by the appended claims While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A radar transceiver comprising:
an electrical balance duplexer coupled to a transmission node of a transmission path, a reception node of a reception path, and an antenna node,
wherein the electrical balance duplexer is configured to isolate the transmission path from the reception path,
wherein the electrical balance duplexer comprises a hybrid transformer network and a non-tunable balancing impedance,
wherein the non-tunable balancing impedance is configured to provide a fixed impedance value that is defined corresponding to an impedance value at the antenna node;
a first switch coupled across the non-tunable balancing impedance;
a second switch coupled in-between the non-tunable balancing impedance and a ground potential; and
a switch-control circuit configured to operate the first switch and the second switch.

2. The radar transceiver according to claim 1, wherein the radar transceiver further comprises an antenna coupled to the antenna node, wherein the impedance value at the antenna node corresponds to an impedance of the antenna.

3. The radar transceiver according to claim 1, wherein the transmission path comprises a signal generator followed by a power amplifier, wherein an output of the power amplifier is coupled to the transmission node, and wherein the reception path comprises a low-noise amplifier followed by a mixer followed by a high-pass filter, and wherein an input of the low-noise amplifier is coupled to the reception node.

4. The radar transceiver according to claim 3, wherein the transmission path is configured to generate a transmit signal and further to transmit the transmit signal via the hybrid transformer network and the antenna, and wherein the reception path is configured to receive, via the antenna and the hybrid transformer network, an antenna signal indicative of an incoming echo corresponding to the transmit signal.

5. The radar transceiver according to claim 4, wherein the radar transceiver further comprises a delay circuit that is coupled between the signal generator and a local oscillation signal input of the mixer and that is configured to delay the transmit signal, thereby providing a delayed version of the transmit signal to the local oscillation signal input of the mixer, and the delay corresponds to at least one of: (i) a delay of a spillover signal from the transmission path to the reception path through the electrical balance duplexer, or (ii) a delay in the antenna signal.

6. The radar transceiver according to claim 4, wherein the signal generator comprises a frequency sweep generator and wherein the transmit signal comprises a swept-frequency signal.

7. The radar transceiver according to claim 1, wherein the radar transceiver is configured to be operated in a first operation mode, a second operation mode, and a third operation mode, wherein the switch-control circuit is configured to open the first switch and to close the second switch during the first operation mode, wherein the switch-control circuit is configured to close the first switch and the second switch during the second operation mode, and wherein the switch-control circuit is configured to open the first switch and the second switch during the third operation mode.

8. The radar transceiver according to claim 1, wherein the radar transceiver further comprises a third switch coupled in-between the reception node and an input of a low-noise amplifier of the radar transceiver, and the switch-control circuit is further configured to operate the third switch.

9. The radar transceiver according to claim 8, wherein the switch-control circuit is configured to:
open the first switch, close the second switch, and close the third switch during a first operation mode,
close the first switch, close the second switch, and close the third switch during a second operation mode, and
open the first switch, open the second switch, and open the third switch during a third operation mode.

10. The radar transceiver according to claim 1, wherein the transmission path and the reception path comprise at least one of single-ended transmission lines or single-ended connections.

11. The radar transceiver according to claim 1, wherein the transmission path and the reception path comprise at least one of differential transmission lines or differential connections.

12. The radar transceiver according to claim 1, wherein the electrical balance duplexer is a wideband electrical balance duplexer.

13. A radar system comprising a plurality of radar transceivers according to claim 1, wherein the radar transceivers are arranged in a one-dimensional array or in a two-dimensional array.

14. The radar system according to claim 13,
wherein each of the plurality of radar transceivers is configured to be operated in a first operation mode or in a second operation mode or in a third operation mode, wherein the switch-control circuit of a radar transceiver of the plurality of radar transceivers is configured to close the first switch and the second switch during the second operation mode, and the switch-control circuit is configured to open the first switch and the second switch during the third operation mode.

15. The radar system according to claim 13,
wherein each of the plurality of radar transceivers is configured to be operated in a first operation mode or in a second operation mode or in a third operation mode, a third switch is coupled in-between the reception node of the given radar transceiver and an input of a low-noise amplifier of the given radar transceiver, and the switch-control circuit is further configured to operate the third switch, wherein the switch-control circuit is configured to:

open the first switch, close the second switch, and close the third switch during the first operation mode;
close the first switch, close the second switch, and close the third switch during the second operation mode; and
open the first switch, open the second switch, and open the third switch during the third operation mode.

16. The radar system according to claim 13,
wherein the transmission path of a given radar transceiver of the plurality of radar transceivers comprises a signal generator followed by a power amplifier, wherein an output of the power amplifier is coupled to the transmission node of the given radar transceiver, wherein the reception path of the given radar transceiver comprises a low-noise amplifier followed by a mixer followed by a high-pass filter, and wherein an input of the low-noise amplifier is coupled to the reception node of the given radar transceiver.

17. The radar system according to claim 16,
wherein the transmission path of the given radar transceiver is configured to generate a transmit signal and further to transmit the transmit signal via a hybrid transformer network and an antenna of the given radar transceiver, and wherein the reception path of the given radar transceiver is configured to receive, via the antenna and the hybrid transformer network, an antenna signal indicative of an incoming echo corresponding to the transmit signal.

18. The radar system according to claim 17,
wherein the given radar transceiver further comprises a delay circuit that is coupled between the signal generator and a local oscillation signal input of the mixer and that is configured to delay the transmit signal, thereby providing a delayed version of the transmit signal to the local oscillation signal input of the mixer, and the delay corresponds to at least one of: (i) a delay of a spillover signal from the transmission path of the given radar transceiver to the reception path of the given radar transceiver through the electrical balance duplexer of the given radar transceiver, or (ii) a delay in the antenna signal.

19. A method for antenna sharing in a radar transceiver including a first switch, a second switch, and a switch-control unit, the method comprising:
operating an electrical balance duplexer to isolate a transmission path from a reception path, wherein the electrical balance duplexer comprises a hybrid transformer network and a non-tunable balancing impedance,
wherein the electrical balance duplexer is coupled to a transmission node of the transmission path, to a reception node of the reception path, and to an antenna node,
wherein the non-tunable balancing impedance is configured to provide a fixed impedance value that is defined corresponding to an impedance value at the antenna node;
coupling the first switch across the non-tunable balancing impedance;
coupling the second switch in-between the non-tunable balancing impedance and a ground potential; and
operating the first switch and the second switch via the switch-control circuit.

* * * * *